United States Patent [19]
Cutsforth et al.

[11] Patent Number: 5,801,926
[45] Date of Patent: Sep. 1, 1998

[54] CIRCUIT CARD EJECTOR DEVICE

[76] Inventors: Robert S. Cutsforth, 1418 4th Ave. South, Anoka, Minn. 55303; Bryan A. Johnsen, 8763 Maplebrook Pkwy., Brooklyn Park, Minn. 55445

[21] Appl. No.: 826,886

[22] Filed: Apr. 8, 1997

[51] Int. Cl.[6] .................................... H05K 7/10
[52] U.S. Cl. .................. 361/754; 361/748; 361/798; 211/41.17; 439/59
[58] Field of Search ................................ 361/727, 728, 361/738, 740, 741, 748, 754, 759, 784, 785, 788, 796, 798; 439/59, 157, 160; 211/41.17

[56] References Cited

U.S. PATENT DOCUMENTS

| | | | |
|---|---|---|---|
| 4,603,375 | 7/1986 | Miller et al. | 361/754 |
| 4,638,405 | 1/1987 | Smith | 361/754 |
| 4,996,631 | 2/1991 | Freehauf | 361/798 |
| 5,293,303 | 3/1994 | Fletcher et al. | 361/798 |
| 5,584,705 | 12/1996 | Lin | 439/157 |

*Primary Examiner*—Leo P. Pichard
*Assistant Examiner*—Jayprakash N. Gandhi
*Attorney, Agent, or Firm*—Nawrocki, Rooney & Sivertson, P.A.

[57] ABSTRACT

A circuit card ejection device for removing a number of circuit cards from a corresponding number of electrical connectors. An elongate panel is attached to an edge of a number of circuit cards opposite an edge having an edge connector. A first position is defined when the number of circuit cards are seated in and in electrical contact relationship with the corresponding number of electrical connectors. A first ejector lever is pivotally coupled to a first pair of sockets and a second ejector lever is pivotally coupled to a second pair of sockets located at a first and second end respectively of the panel where the plane of each one of the number of circuit cards is positioned between the first pair of sockets and between the second pair of sockets. A pivoting of the first ejector lever and the second ejector lever to a second position causes engagement surfaces of the first ejector lever and second ejector lever to engage a top end of a first frame member and a second frame member respectively to provide an extraction force directed within the plane of each one of the number of circuit cards. The extraction force moves the panel out of an abutting relationship with the top end of the first frame member and second frame member so that the number of circuit cards are no longer seated within the corresponding number of electrical connectors.

31 Claims, 4 Drawing Sheets

CIRCUIT CARD EJECTOR DEVICE

TECHNICAL FIELD

This invention relates to a circuit card ejection device for removing a number of circuit cards from a corresponding number of electrical connectors, and more particularly to a circuit card ejection device comprising a panel attached to an edge of a number of circuit cards where a first ejector lever and second ejector lever rotatably coupled at opposing ends of the panel are pivoted from a first to a second position to engage fixed surfaces to provide an extraction force directed within the plane of each one of the number of circuit cards to remove the number of circuit cards from the corresponding number of electrical connectors.

BACKGROUND OF THE INVENTION

Electronic components are typically mounted onto printed circuit boards. The printed circuit boards have electrical edge connectors which provide means for interconnecting the electronic components on one printed circuit board with the electronic components on one or more other printed circuit boards. Often times groups of circuit boards are interconnected by placement into housings or card cages, wherein the card cages include mounting hardware and electrical connectors, where the electrical connectors are aligned with edge connectors on the printed circuit board. The card cages often include a pair of spaced guides to slidably receive opposite edges of a printed circuit board to align the printed circuit board with an electrical connector.

A printed circuit board mounted inside the card cage may have a number of electrical connectors mounted in a perpendicular relationship to the spaced card guides, wherein the circuit board being secured inside the card cage allows a number of printed circuit boards to be inserted to engage the number of electrical connectors in a direction perpendicular to the surface of the printed circuit board containing the number of connectors.

The printed circuit board containing the number of electrical connectors may be designed to provide a specific electrical interconnection between the number of printed circuit boards with the electronic components. When a printed circuit board is plugged into a corresponding electrical connector, the edge connector of the printed circuit board being plugged into the associated electrical connector within the card cage may make it difficult to remove the printed circuit board from the electrical connector. A substantial force may be required to disconnect the edge connector from the electrical connector to remove the printed circuit board from the back plane.

Often times to facilitate this removal, pivoting levers have been used. Typically two handles are provided which are pivotally mounted to a panel. The panel is then mounted to a front edge of a printed circuit board opposite the edge plugged into the electrical connector to aid in extracting the printed circuit board from the electrical connector within the card cage. With this approach, a surface is provided wherein the handles are used in a pivoting fashion to push against the surface to assist in providing the force necessary to disconnect the edge connector from the electrical connector mounted in the card cage.

The handles or pivoting levers disclosed in the prior art have required several components being assembled to construct each handle. These components are typically comprised of at least a lever element, a pin, and a means to hold the pin to attach the lever element to the panel. Although these handles may reduce the force necessary to be applied by the user to extract the printed circuit board, often times the extraction force is not parallel to the plane of the printed circuit board. The design of the handle thus results in an extraction force not in the plane of the printed circuit card. Also, the use of a single pin still results in rotational or bending forces within the printed circuit board as the lever element may allow a degree of lateral movement to facilitate the pivoting. This may result in rotational movements within the printed circuit board during extraction which may damage the printed circuit board over time. Solder connections used to mount the electronic components to the printed circuit board may loosen making component failure more likely.

There are examples in the prior art of this type of circuit board ejector device. U.S. Pat. No. 4,603,375, issued Jul. 29, 1986 to Miller et al., for "Ejector For Printed Circuit Board Ejector Device", describes an ejector for a printed circuit board plug-in unit having fixed ejection surfaces and a panel member integrally secured to the printed circuit board with an ejector mounted having a handle portion to engage the fixed ejection surface. U.S. Pat. No. 4,638,405, issued Jan. 20, 1987 to Smith, for "Injector/Ejector Device for a Circuit Board", describes a device for aiding in the injection and removal of printed circuit boards comprising anchor means for affixing the device to the printed circuit board and lever means to develop linear inward and outward directed forces. U.S. Pat. No. 5,293,303, issued Mar. 8, 1994, to Fletcher et al., for "Circuit Board Injector/Ejector Device for a Circuit Board Enclosure", discloses a device having a front plate secured to the circuit board and a lever pivotally mounted on the body.

Although these devices generate a mechanical advantage to assist in removing printed circuit cards from electrical connectors, they all require several components being assembled to construct each handle.

SUMMARY OF THE INVENTION

Accordingly, it is an object of the invention to provide a circuit card ejector device for removing a number of circuit cards from a corresponding number of electrical connectors. An elongate panel is attached to an edge of a single or a plurality of circuit cards opposite the edge having the edge connector. A first position is defined when the number of circuit cards are seated in and in electrical contact relationship with the corresponding number of electrical connectors.

A first ejector lever is pivotally coupled to a first pair of sockets, and a second ejector lever is pivotally coupled to a second pair of sockets. The first pair of sockets and the second pair of sockets are located at a first and second end, respectively, of the panel where the generally planar surface of each one of the number of circuit cards is positioned between the first pair of sockets and between the second pair of sockets to maintain the extraction force within or parallel to the plane of each one of the number of circuit cards. A distance between the first pair of sockets and the second pair of sockets may be increased or decreased to accommodate an additional number of circuit cards.

A pivoting of the first ejector lever and the second ejector lever to a second position causes engagement surfaces of the first ejector lever and second ejector lever to engage a top end of a first frame member and a second frame member, respectively, to provide the extraction force directed within or parallel to the plane of each one of the number of circuit cards. The extraction force moves the panel out of an abutting relationship with the end of the first frame member and second frame member so that the number of circuit cards are no longer seated and in electrical contact relationship with the corresponding number of electrical connectors.

In a preferred embodiment of the present invention, an apparatus for removing a number of circuit cards from a number of electrical connectors is provided, where the number of electrical connectors are mounted on a back plane contained within a housing and where each one of the number of circuit cards has an edge connector adapted to be removably seated in an electrically contacting relationship with a corresponding one of the number of electrical connectors. The number of electrical connectors are positioned between a first frame member and a second frame member, where the first frame member and the second frame member are each attached at a lower end to the housing adjacent opposing ends of each of the number of electrical connectors and extend substantially a length of the number of circuit cards.

In a preferred embodiment, an elongate panel is provided having a first end and a second end which is attached to an edge of each one of the number of circuit cards, where the edge of each one of the number of circuit cards opposes the edge connector in a direction along the length. Each one of the number of circuit cards is parallel to every other one of the number of circuit cards and the panel is attached in a plane substantially perpendicular to a plane of each one of the number of circuit cards.

The panel comprises a first lower surface adjacent a first end, a second lower surface adjacent the second end, a first pair of sockets adjacent the first lower surface such that the plane of each one of the number of circuit cards are positioned therebetween, and a second pair of sockets adjacent the second lower surface such that the plane of each one of the number of circuit cards are positioned therebetween.

In a preferred embodiment, a first ejector lever is provided comprising a pair of legs joined by a handle portion, wherein each leg has a socket engagement element and a foot, each socket engagement element seated within and pivotally engaged in a corresponding one of the first pair of sockets to pivotally couple the first ejector lever to the panel. The first ejector lever pivots over or around an axis perpendicular to the plane of each one of the number of circuit cards. Each foot has an engagement surface adjacent the first lower surface and disposed on opposing sides of the plane of each one of the number of circuit cards to engage a top end of the first frame member in response to a pivotal movement of the first ejector lever.

In a preferred embodiment, a second ejector lever is provided comprising a pair of legs joined by a handle portion, wherein each leg has a socket engagement element and a foot, each socket engagement element is seated within and pivotally engaged in a corresponding one of the second pair of sockets to pivotally couple the second ejector lever to the panel. The second ejector lever pivots over or around an axis perpendicular to the plane of each one of the number of circuit cards. Each foot has an engagement surface adjacent the second lower surface and disposed on opposing sides of the plane of each one of the number of circuit cards to engage a top end of the second frame member in response to a pivotal movement of the second ejector lever.

In a preferred embodiment, the first ejector lever and the second ejector lever are in a first position when each one of the number of circuit cards is in a removably seated and electrically contacting relationship with the corresponding one of the number of electrical connectors. In the first position, the first lower surface is abutting the top end of the first frame member and the second lower surface is abutting the top end of the second frame member. A pivoting force being applied to the first ejector lever and the second ejector lever pivots the first ejector lever and the second ejector lever to a second position. Pivoting the first ejector lever to the second position causes each engagement surface of each foot of the first ejector lever to move in a cooperative relationship relative to the first lower surface to engage the top end of the first frame member. Likewise, pivoting the second ejector lever to the second position causes each engagement surface of each foot of the second ejector lever to move in a cooperative relationship relative to the second lower surface to engage the top end of the second frame member.

Pivoting the first ejector lever and the second ejector lever to the second positions provides an extraction force to extract the number of circuit cards in a direction along the length thereof towards the panel from the removably seated and electrical contact relationship with the number of electrical connectors. The second position is defined by each one of the number of circuit cards not being seated within the corresponding one of the number of electrical connectors. The planes of each one of the number of circuit cards being positioned between the engagement surface of each foot of the first ejector lever and the planes of each one of the number of circuit cards being positioned between the engagement surface of each foot of the second ejector lever provides the extraction force within the plane or parallel to the plane of any one of the number of circuit cards.

In a preferred embodiment, the pivoting force is applied to the handle portion of the first ejector lever in a direction from the second end towards the first end of the panel and is applied to the handle portion of the second ejector lever in a direction from the first end towards the second end of the panel. Pivoting the first ejector lever from the first position to the second position moves the engagement surface of each foot from a position within the plane of the first lower surface to a position below the plane of the first lower surface in a direction closer to the number of electrical connectors than the first lower surface. The engagement surface of each foot engages the top end of the first frame member and moves the first lower surface out of the abutting relationship with the top end of the first frame member. Pivoting the second ejector lever from the first position to the second position moves the engagement surface of each foot from a position within a plane of the second lower surface to a position below the plane of the second lower surface in a direction closer to the number of electrical connectors than the second lower surface. The engagement surface of each foot engages the top end of the second frame member and moves the second lower surface out of the abutting relationship with the top end of the second frame member. It is recognized that the number of circuit cards may be any number, but is preferably one circuit card, and the number of electrical connectors may be any number, but is preferably one electrical connector. In a preferred embodiment, the first ejector lever and the second ejector lever may be constructed of any material, but are preferably constructed of sheet metal.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
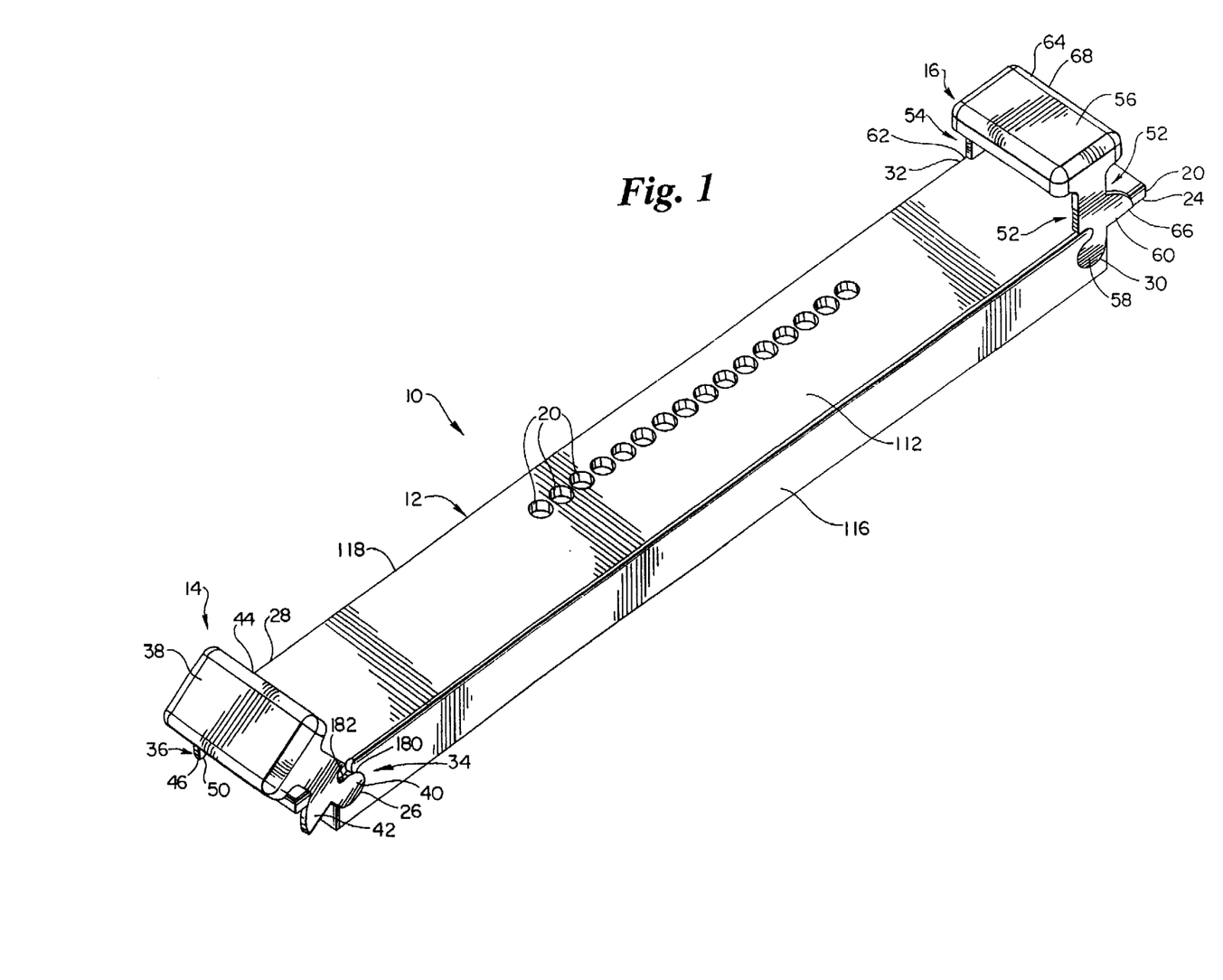
FIG. 1 is a perspective view of a circuit card ejector device showing a preferred embodiment of the present invention.

Referring now to the drawings, wherein like reference numerals refer to like elements throughout the several views, FIG. 1 is a perspective view of the circuit card ejector device showing a preferred embodiment of the present invention. FIG. 1 shows generally a circuit card ejector 10 which is comprised of an elongate panel 12, a first ejector lever 14, and a second ejector lever 16. Panel 12 has a first end 18 and a second end 20. Panel 12 further comprises a first lower surface 22 adjacent first end 18, and a second lower surface 24 adjacent second end 20. Panel 12 has a first pair of sockets which comprise socket 26 and socket 28 which are adjacent first lower surface 22. Panel 12 has a second pair of sockets comprising socket 30 and socket 32, which are adjacent second lower surface 24.

First ejector lever 14 comprises a pair of legs which are leg 34 and leg 36, which are joined by a handle portion 38. Leg 34 is comprised of socket engagement element 40 and foot 42. Leg 36 is comprised of socket engagement element 44 and foot 46. Socket engagement elements 44 and 46 are seated within and pivotally engage socket 26 and socket 28, respectively, to pivotally couple first ejector lever 14 to panel 12. Foot 42 has an engagement surface 48 adjacent first lower surface 22 and foot 46 has an engagement surface 50 adjacent first lower surface 22.

Second ejector lever 16 comprises a pair of legs which are leg 52 and leg 54. Leg 52 and leg 54 are joined by handle portion 56. Leg 52 has socket engagement element 58 and foot 60. Leg 54 has socket engagement element 62 and foot 64. Socket engagement element 58 is seated within, and pivotally engages socket 30 and socket engagement element 62 is seated within and pivotally engages socket 32 to pivotally couple second ejector lever 16 to panel 12. Foot 60 has engagement surface 66 adjacent second lower surface 24. Foot 64 has engagement surface 68 adjacent second lower surface 24. Panel 12 further has a plurality of holes 70 which may be utilized for any number of purposes including attachment of indication means such as light emitting diodes to an underside of panel 12 to indicate status of an attached circuit card (see, FIG. 2).

Figure 2:
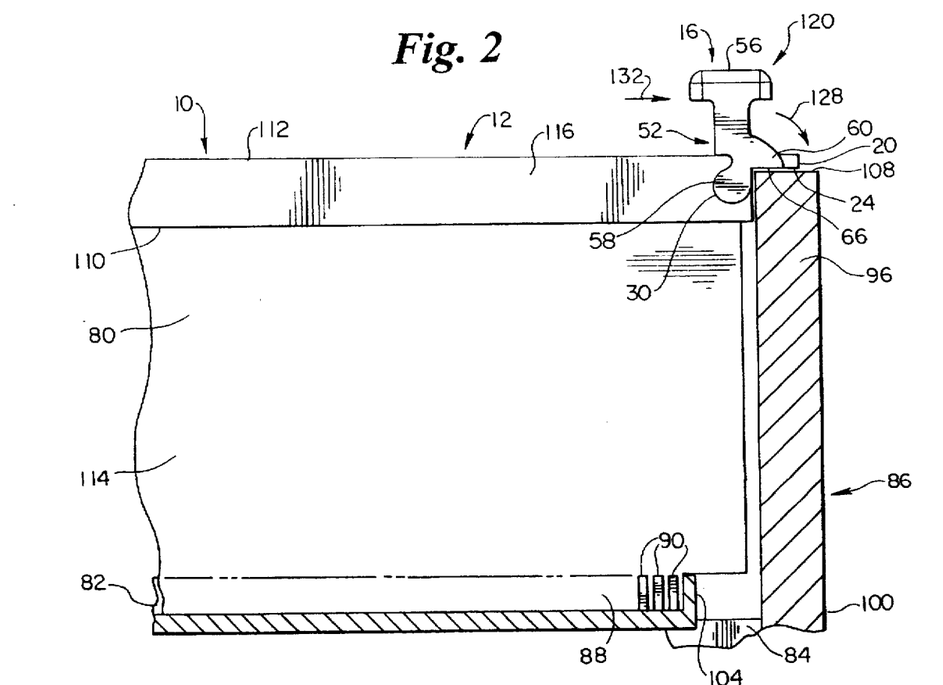
FIG. 2 is a partial cross-section view showing the circuit card ejector device attached to a circuit card which is seated and in an electrical contact relationship with an electrical connector.
Figure 3:
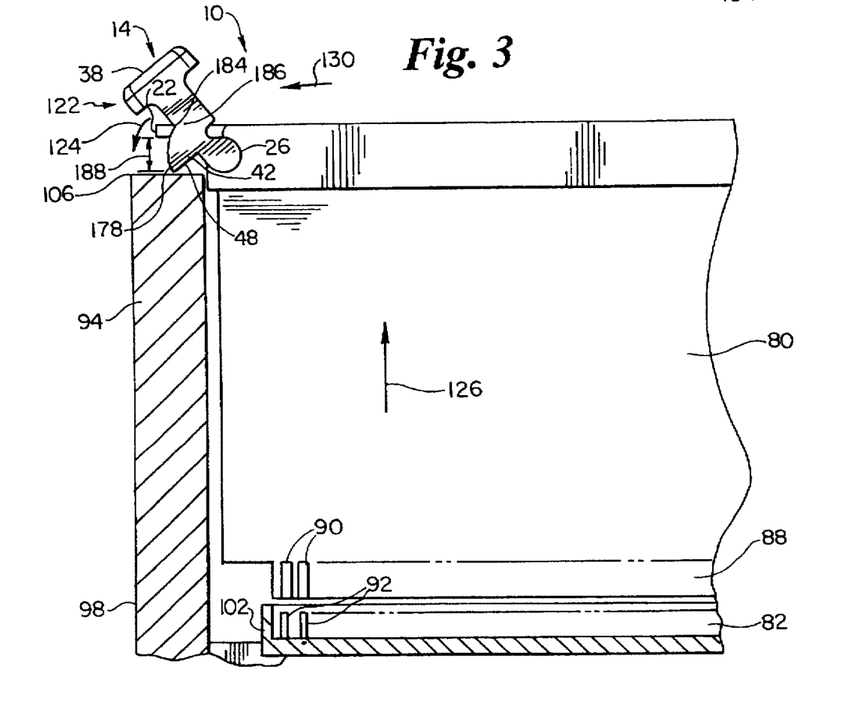
FIG. 3 is a partial cross-section view showing the circuit card ejector device attached to the circuit card which is not in a seated relationship with the electrical connector.

FIGS. 2 and 3 are partial cross-sectional views showing the circuit card ejector device attached to the circuit card. FIG. 2 shows a circuit card 80 in a seated and in an electrical contact relationship with electrical connector 82. FIG. 3 shows circuit card 80 in ejected position where it is not seated within electrical connector 82. FIG. 2 and FIG. 3 show circuit card ejector 10 including a panel 12, a first ejector lever 14 and second ejector lever 16. Circuit card ejector 10 may remove a number of circuit cards from a number of electrical connectors, wherein the number of electrical connectors may be mounted on back plane 84 which is contained within a housing 86. For illustrative purposes, however, only one circuit card 80 and one electrical connector 82 are shown and described.

Circuit card 80 has an edge connector 88 comprising a plurality of electrical contacts 90. When circuit card 80 is removably seated in electrical connector 82, as shown in FIG. 2, electrical contacts 90 contact connector contacts 92 of electrical connector 82 to maintain an electrically contacting relationship with electrical connector 82.

Electrical connector 82 is positioned between a first frame member 94 and a second frame member 96. First frame member 94 is attached at a lower end 98 to housing 86. Second frame member 96 is attached at a lower end 100 to housing 86. Lower end 98 and lower end 100 are adjacent opposing ends of electrical connector 82. Lower end 98 is adjacent end 102 of electrical connector 82. Lower end 100 is adjacent end 104 of electrical connector 82. First frame member 94 extends substantially a length of circuit card 80 between lower end 98 and a top end 106. Second frame member 96 extends substantially a length of circuit card 80 between lower end 100 and a top end 108. Panel 12 is attached to an edge 110 of circuit card 80, such that surface 112 of panel 12 is substantially perpendicular to a plane of circuit card surface 114. It is understood that if a number of circuit cards were attached to panel 12, each one of the number of circuit cards would be parallel to every other one of the number of circuit cards, wherein panel 12 would be attached such that the plane of surface 112 would be substantially perpendicular to a plane of each one of the number of circuit cards.

Sockets 26 and 28 are positioned on sides 116 and 118, respectively, such that the plane of surface 114 of circuit card 80 is positioned between socket 26 and socket 28 (see, FIG. 1). Socket 30 is positioned on side 116 and socket 32 is positioned on side 118, such that the plane of surface 114 of circuit card 80 is between socket 30 and socket 32. First ejector lever 14 pivots over or around an axis which is perpendicular to the plane of surface 114 of circuit card 80. Second ejector lever 16 pivots over or around an axis perpendicular to the plane of surface 114 of circuit card 80. Engagement surface 48 of foot 42 and engagement surface 50 of foot 46 are disposed on opposing sides of the plane of surface 114 of circuit card 80 to engage top end 106 of first frame member 94 in response to a pivotal movement of first ejector lever 14. Engagement surface 66 of foot 60 and engagement surface 68 of foot 64 are disposed on opposing sides of the plane of surface 114 of circuit card 80 to engage top end 108 of second frame member 96 in response to a pivotal movement of second ejector lever 16.

First ejector lever 14 and second ejector lever 16 are in a first position 120 when circuit card 80 is in a removably seated and electrically contacting relationship with electrical connector 82 as shown in FIG. 2. In reference to FIG. 2, first position 120 occurs when second lower surface 24 is abutting top end 108 of second frame member 96. In a likewise fashion, first position 120 occurs when first lower surface 22 is abutting top end 106 of first frame member 94 (not shown).

A pivoting force being applied to first ejector lever 14 and second ejector lever 16 pivot first ejector lever 14 and second ejector lever 16 to a second position 122 as shown in FIG. 3. Pivoting first ejector lever 14 to second position 122 occurs because engagement surface 48 of foot 42 and engagement surface 50 of foot 46 move in a cooperative relationship relative to first lower surface 22 and engage top end 106 of first frame member 94. In a likewise fashion, engagement surface 66 of foot 60 and engagement surface 68 of foot 64 of second ejector lever 16 move in a cooperative relationship relative to second lower surface 24 to engage top end 108 of second frame member 96. Pivoting first ejector lever 14 from first position 120 to second position 122 in the direction of arrow 124 (and likewise pivoting second ejector lever 16 from first position 120 to second position 122 in the direction of arrow 128) provides an extraction force in the direction of arrow 126 to extract circuit card 80 in a direction along the length of first frame member 94 from lower end 98 to top end 106 and second frame member 96 from lower end 100 to top end 108 towards panel 12 to remove circuit card 80 from the removably seated and electrical contact relationship with electrical connector 82 as shown in FIG. 2. Thus, FIG. 3 shows the second position as defined by circuit card 80 not being seated within electrical connector 82. Since the plane of surface 114 is between engagement surface 48 and engagement surface 50 of first ejector lever 14 and engagement surface 66 and engagement surface 68 of second ejector lever 16, the extraction force shown by arrow 126 is maintained in an upward direction within the plane or parallel to the surface 114. It is understood that if a number of circuit cards were being extracted in a likewise fashion with all planes of each of the number of circuit cards being positioned between engagement surface 48 and engagement surface 50 of first ejector lever 14 and engagement surface 66 and engagement surface 68 of second ejector lever 16, the extraction force would be provided within the plane of any one of the number of circuit cards. The card 80 is thus pulled straight out of the socket 82 without applying any bending forces to the card 80.

In a preferred embodiment, first ejector lever 14 is pivoted from first position 120 to second position 122 by applying a pivoting force to handle portion 38 to pivot first ejector lever 14 in the direction shown by arrow 124. In a likewise fashion, second ejector lever 16 is pivoted from first position 120 to second position 122 by applying a pivoting force to handle portion 56 in the direction shown by arrow 128. This pivoting force may comprise a first pivoting force and a second pivoting force, wherein the first pivoting force is applied to handle element 38 of first ejector lever 14 in a direction from second end 20 towards first end 18 in the direction of arrow 130 to pivot first ejector lever 14 in the direction of arrow 124. The second pivoting force is applied to handle portion 56 of second ejector lever 16 in a direction from first end 18 towards second end 20 in the direction of arrow 132 to pivot second ejector lever 16 in the direction shown by arrow 128.

Figure 4:
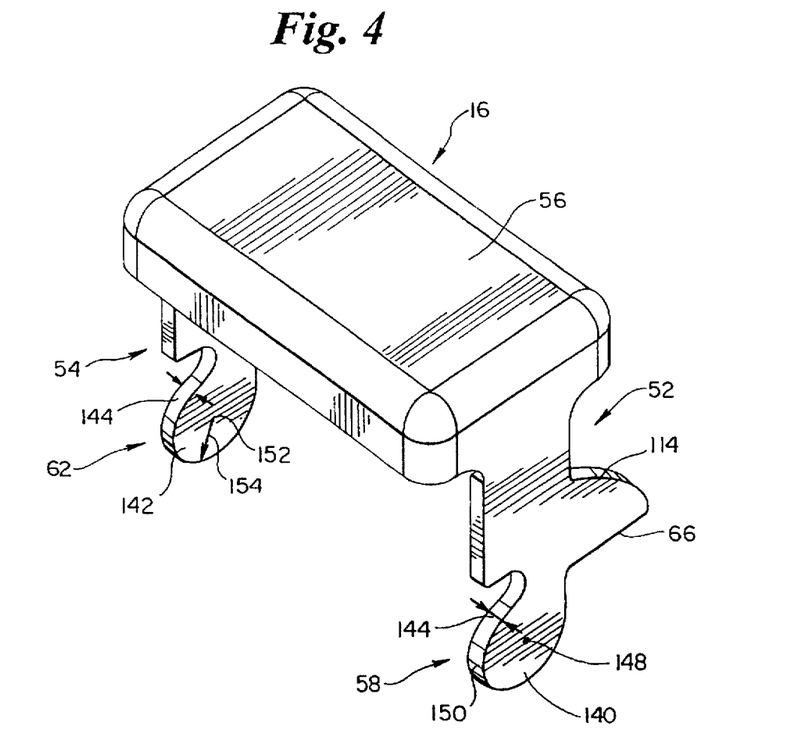
FIG. 4 is a perspective view of the ejector lever of a preferred embodiment of the present invention.
Figure 5:
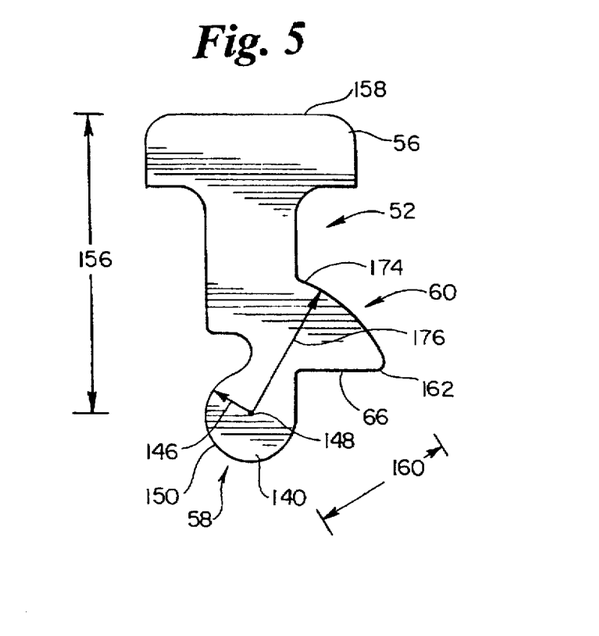
FIG. 5 is a side view of the ejector lever of a preferred embodiment of the present invention.

FIGS. 4 and 5 show a perspective view and side view, respectively, of second ejector lever 16. Although second ejector lever 16 is shown and described in FIGS. 4 and 5, it is understood that in all respects the design and function of second ejector lever 16 is equivalent to first ejector lever 14. In FIG. 4, socket engagement element 58 has a generally circular element 140, and socket engagement element 62 has a generally circular element 142. Circular element 140 and circular element 142 each have a thickness 144. A minor radius 146 is defined between a center 148 of circular element 140 and outer perimeter 150 of circular element 140. Circular element 142 of socket engagement element 62 has a similarly defined minor radius 154. Socket 30 and socket 32 are outwardly open away from the plane of surface 114 of circuit card 80. Socket 30 is sized to receive and pivotally engage circular element 140, and socket 32 is sized to receive and pivotally engage circular element 142 so that the rotation axis of second ejector lever 16 corresponds to center 148 of circular element 140 and center 152 of circular element 142, where the rotation axis is maintained in the direction perpendicular to the plane of surface 114 of circuit card 80.

Handle portion 56 couples to leg 52 and leg 54 to impart an inward urging force upon circular element 140 and circular element 142 in a direction towards and perpendicular to surface 114 of circuit card 80 in order to hold circular element 140 and circular element 142 within socket 30 and socket 32, respectively, in a received and pivotally engaged relationship.

First ejector lever 14 and second ejector lever 16 further comprise leg 34, leg 36, leg 52 and leg 54 having a first distance being greater than a second distance. In FIG. 5, the first distance and the second distance are measured in a direction perpendicular to the axis of rotation of leg 52. First distance 156 is measured between center 148 and a top surface 158 of handle portion 56. A second distance 160 is measured between center 148 and a distal end 162 of engagement surface 66, where distal end 162 is defined as the portion of the engagement surface furthest from center 146. First distance 156 being greater than second distance 160 provides a mechanical advantage upon rotation of first ejector lever 14 or second ejector lever 16 to facilitate ease of application of the extraction force shown by arrow 126 necessary to remove circuit card 80 from electrical connector 82. First ejector lever 14 and second ejector lever 16 each further comprise each leg having the second distance being greater than the minor radius defined above. In FIG. 5, second distance 160 is greater than minor radius 146 so that when circular element 140 is in the received and pivotally engaged relationship with socket 30, engagement surface 66 may contact top end 108 as second ejector lever 16 is pivoted from the first position 120 to the second position 122 in the direction of arrow 128.

Figure 6:
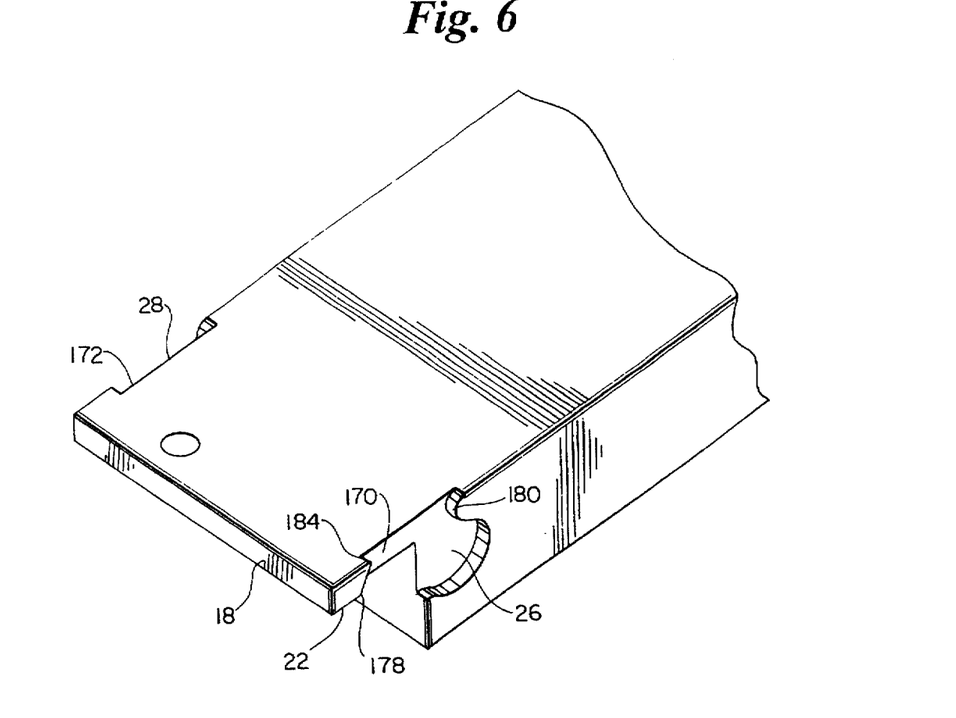
FIG. 6 is a partial perspective view of a portion of the panel of a preferred embodiment of the present invention.

FIG. 6 is a partial plan view of a portion of panel 12. It is understood that although FIG. 6 shows first end 18 of panel 12, but not second end 20, panel 12 is symmetrical in design and in all respects the description of the area of panel 12 about first end 18 is identical to the area of panel 12 about second end 20. In FIG. 6, first lower surface 22 has an opening 170 and an opening 172 corresponding to engagement surface 48 and engagement surface 50, respectively. Engagement surfaces 48 and 50 corresponding to foot 42 and 46, respectively. Foot 42 and 46 pass through opening 170 and opening 172, respectively, as first ejector lever 14 is pivoted from first position 120 to second position 122. Pivoting first ejector lever 14 from first position 120 to second position 122 moves engagement surface 48 of foot 42 and engagement surface 50 of foot 46 from a position within a plane of first lower surface 22 to a position below the plane of first lower surface 22 in a direction closer to electrical connector 82 than first lower surface 22 in order to engage top end 106 of first frame member 94 to move first lower surface 22 out of the abutting relationship with top end 106 of first frame member 94.

FIG. 2 shows engagement surface 66 within the same plane as second lower surface 24 when second ejector lever 16 is in first position 120. FIG. 3 shows engagement surface 48 being closer to electrical connector 82 than first lower surface 22 when first ejector lever 14 is in second position 122.

Each foot has an arcuate outer perimeter. FIG. 5 shows foot 60 having arcuate outer perimeter 174 which is defined by major radius 176, wherein major radius 176 is equivalent to second distance 160. Outer perimeter 174 maintains the same distance between a portion of outer perimeter 174 within the plane of first lower surface 22 in FIG. 6, and an edge 178 of opening 170 within the plane of first lower surface 22 as foot 42 of first ejector lever 14 is rotated from first position 120 to second position 122 (see also, FIG. 1).

A first position stopping surface on each leg engages a corresponding first position stopping surface on panel 12 when the leg is in first position 120 to prevent the engagement surface of each foot from moving to a position above the plane of the first lower surface. In FIG. 6, first position stopping surface 180 engages first position stopping surface 182 of leg 34 when first ejector lever 14 is in first position 120 to prevent a rotation of first ejector lever 14 in a direction opposite arrow 124 beyond first position 120 so that engagement surface 48 of foot 42 does not move to a position above the plane of first lower surface 22 (see also, FIG. 1).

A second position stopping surface on each leg engages a corresponding second position stopping surface on the panel when in second position 122 which prevents the engagement surface of each foot from moving beyond a predefined distance below the plane of the first lower surface. In FIGS. 6 and 3, second position stopping surface 184 engages a corresponding second position stopping surface 186 to prevent engagement surface 48 of foot 42 from moving beyond predefined distance 188 below the plane of first lower surface 22. The above described shape of the ejector holds the ejector securely mounted to the panel while allowing desired rotation from the first to the second position.

Figure 7:
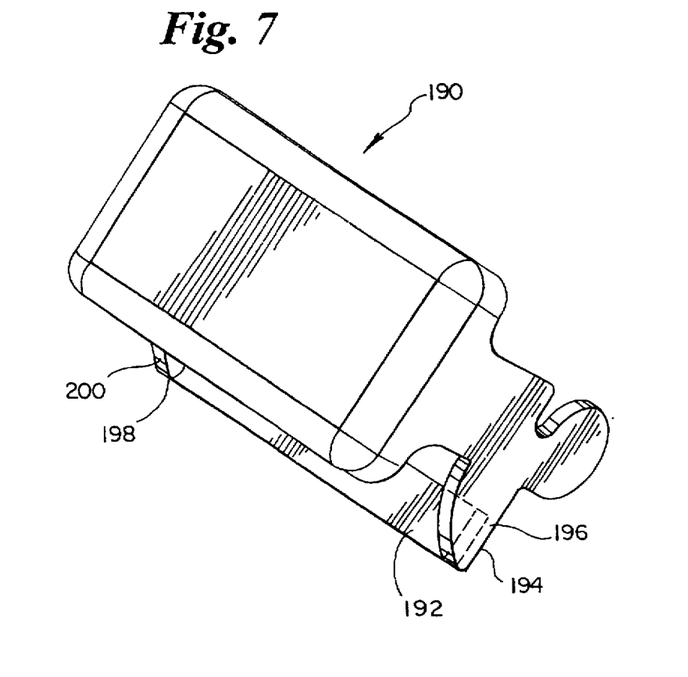
FIG. 7 is a perspective view of the ejector lever of an alternative embodiment of the present invention.

FIG. 7 is a perspective view of the ejector lever of an alternative embodiment of the present invention. The ejector lever 190 is equivalent in shape to first ejector lever 14 with the exception of the addition of panel member 192. Panel member 192 couples between an engagement surface 194 of foot 196 and an engagement surface 198 of foot 200. Panel member 192, in the alternative embodiment, may replace a portion of first lower surface 22 between approximately first end 18 and second position stopping surface 184. A lower surface of panel member 192 may engage top end 106 of first frame member 94 to provide the extraction force in the direction of arrow 126 to extract circuit card 80 from electrical connector 82 when ejector lever 190 is pivoted from first position 120 to second position 122. It is understood that many complimentary designs of panel 12 in combination with an ejector lever such as ejector lever 190 are within the scope of the present invention. Furthermore, it is understood that the first ejector lever 14, second ejector lever 16 or ejector lever 190 may be constructed with any number of materials, but are preferably constructed of sheet metal.

Having thus described the preferred embodiments of the present invention, those of skill in the art will readily appreciate that yet other embodiments may be made and used within the scope of the claims hereto attached.

What is claimed:

1. An apparatus for removing a number of circuit cards from a number of electrical connectors, said number of electrical connectors mounted on a back plane contained within a housing, each one of said number of circuit cards having an edge connector adapted to be removably seated in an electrically contacting relationship with a corresponding one of said number of electrical connectors, said number of electrical connectors being positioned between a first frame member and a second frame member, said first frame member and said second frame member each attached at a lower end to said housing adjacent opposing ends of each of said number of electrical connectors and extending substantially a length of said number of circuit cards, said apparatus comprising:

a. an elongate panel having a first end and a second end which is attached to an edge of each one of the number of circuit cards, said edge of each one of the number of circuit cards opposing the edge connector in a direction along said length, each one of the number of circuit cards parallel to every other one of the number of circuit cards, said panel being attached in a plane substantially perpendicular to a plane of each one of the number of circuit cards, said panel comprising a first lower surface adjacent said first end, a second lower surface adjacent said second end, a first pair of sockets adjacent said first lower surface such that said plane of said each one of the number of circuit cards are positioned therebetween, a second pair of sockets adjacent said second lower surface such that said plane of said each one of the number of circuit cards are positioned therebetween;

b. a first ejector lever comprising a pair of legs joined by a handle portion wherein each leg has a socket engagement element and a foot, each said socket engagement element seated within and pivotally engaging a corresponding one of said first pair of sockets to pivotally couple said first ejector lever to said panel, said first ejector lever pivoting over an axis perpendicular to said plane of said each one of the number of circuit cards, each said foot having an engagement surface adjacent said first lower surface and disposed on opposing sides of said plane of said each one of the number of circuit cards to engage a top end of said first frame member in response to a pivotal movement of said first ejector lever; and c. a second ejector lever comprising a pair of legs joined by a handle portion wherein each leg has a socket engagement element and a foot, each said socket engagement element seated within and pivotally engaging a corresponding one of said second pair of sockets to pivotally couple said second ejector lever to said panel, said second ejector lever pivoting over an axis perpendicular to said plane of said each one of the number of circuit cards, each said foot having an engagement surface adjacent said second lower surface and disposed on opposing sides of said plane of said each one of the number of circuit cards to engage a top end of said second frame member in response to a pivotal movement of said second ejector lever, said first ejector lever and said second ejector lever being in a first position when each one of the number of circuit cards is in a removably seated and electrically contacting relationship with the corresponding one of the number of electrical connectors when said first lower surface is abutting said top end of said first frame member and said second lower surface is abutting said top end of said second frame member, a pivoting force being applied to said first ejector lever and said second ejector lever to pivot said first ejector lever and said second ejector lever to a second position causing each said engagement surface of each said foot of said first ejector lever to move in a cooperative relationship relative to said first lower surface to engage said top end of said first frame member and each said engagement surface of each said foot of said second ejector lever to move in a cooperative relationship relative to said second lower surface to engage said top end of said second frame member to provide an extraction force to extract the number of circuit cards in a direction along said length towards said panel from said removably seated and electrical contact relationship with the number of electrical connectors, the second position defined by each one of the number of circuit cards not being seated within the corresponding one of the number of electrical connectors, all said planes of said each of the number of circuit cards being positioned between said engagement surface of each foot of said first ejector lever and all said planes of said each of the number of circuit cards being positioned between said engagement surface of each foot of said second ejector lever providing said extraction force within said plane of any one of the number of circuit cards.

2. An apparatus for removing a number of circuit cards from a number of electrical connectors according to claim 1 wherein the pivoting force comprises a first pivoting force and a second pivoting force, said first pivoting force applied to said handle portion of said first ejector lever in a direction from the second end towards the first end of said panel and said second pivoting force applied to said handle portion of said second ejector lever in a direction from the first end towards the second end of said panel.

3. An apparatus for removing a number of circuit cards from a number of electrical connectors according to claim 1 wherein the pivoting force is applied to said handle portion of said first ejector lever and to said handle portion of said second ejector lever.

4. An apparatus for removing a number of circuit cards from a number of electrical connectors according to claim 1 wherein the first ejector lever and the second ejector lever further comprise each one of the socket engagement elements having a circular element, said circular element having a thickness, a minor radius being defined between a center of said circular element and an outer perimeter of said circular element, each one of the pair of sockets being outwardly open away from the plane of each one of the number of circuit cards and sized to receive and pivotally engage a corresponding circular element of the corresponding one of the pair of socket engagement elements so that the rotation axis corresponds to said center of said corresponding circular element of the corresponding one of the pair of socket engagement elements, said minor radius being in a direction parallel to the plane of each one of the number of circuit cards, the handle portion imparting an inward urging force upon each corresponding circular element of the corresponding one of the pair of socket engagement elements in a perpendicular direction towards the plane of the circuit card to hold each said one of each corresponding circular element of the corresponding one of the pair of socket engagement elements in the received and pivotally engaged relationship with the corresponding one of the pair of sockets.

5. An apparatus for removing a number of circuit cards from a number of electrical connectors according to claim 4 wherein the first ejector lever and the second ejector lever each further comprise each leg having a first distance being greater than a second distance, said first distance and said second distance measured in a direction perpendicular to the axis of rotation of each leg, said first distance measured between the center and a top surface of the handle portion, said second distance measured between the center and a distal end of the engagement surface, said distal end defined as the portion of the engagement surface furthest from the center.

6. An apparatus for removing a number of circuit cards from a number of electrical connectors according to claim 5 wherein said first ejector lever and said second ejector lever each further comprise each leg having the second distance being greater than the minor radius.

7. An apparatus for removing a number of circuit cards from a number of electrical connectors according to claim 6 wherein the first lower surface has an opening corresponding to each engagement surface for each foot for passing the engagement surface therethrough as the first ejector lever is pivoted from the first position to the second position, wherein pivoting the first ejector lever from the first position to the second position moves the engagement surface of each foot from a position within a plane of the first lower surface to a position below said plane of said first lower surface in a direction closer to the number of electrical connectors than the first lower surface to engage the top end of the first frame member and move the first lower surface out of the abutting relationship with the top end of the first frame member, each foot having an arcuate outer perimeter defined by a major radius equivalent to the second distance to maintain a same distance between the portion of said outer perimeter within said plane of the first lower surface and an edge of the opening within said plane of the first lower surface as the foot is rotated from the first position to the second position.

8. The apparatus of claim 7, further comprising a first position stopping surface on each leg engaging a corresponding first position stopping surface on the panel when the leg is in the first position to prevent the engagement surface of each foot from moving to a position above the plane of the first lower surface, a second position stopping surface on each leg engaging a corresponding second position stopping surface on the panel when in the second position to prevent the engagement surface of each foot from moving beyond a predefined distance below the plane of the first lower surface.

9. An apparatus for removing a number of circuit cards from a number of electrical connectors according to claim 6 wherein the second lower surface has an opening corresponding to each engagement surface for each foot for passing the engagement surface therethrough as the second ejector lever is pivoted from the first position to the second position, pivoting the second ejector lever from the first position to the second position moving the engagement surface of each foot from a position within a plane of the second lower surface to a position below said plane of said second lower surface in a direction closer to the number of electrical connectors than the second lower surface to engage the top end of the second frame member and move the second lower surface out of the abutting relationship with the top end of the second frame member, each foot having an arcuate outer perimeter defined by a major radius equivalent to the second distance to maintain a same distance between the portion of said outer perimeter within said plane of the second lower surface and an edge of the opening within said plane of the second lower surface as the foot is rotated from the first position to the second position, a first position stopping surface on each leg engaging a corresponding first position stopping surface on the panel when the leg is in the first position to prevent the engagement surface of each foot from moving to a position above the plane of the second lower surface, a second position stopping surface on each leg engaging a corresponding second position stopping surface on the panel when in the second position to prevent the engagement surface of each foot from moving beyond a predefined distance below the plane of the second lower surface.

10. An apparatus for removing a number of circuit cards from a number of electrical connectors according to claim 1 wherein the cooperative relationship is defined by the pivoting of the first ejector lever from the first position to the second position moving the engagement surface of each foot from a position within a plane of the first lower surface to a position below the first lower surface and in a direction closer to the electrical connector than the first lower surface to engage the top end of the first frame member and move the first lower surface out of the abutting relationship with the top end of the first frame member.

11. An apparatus for removing a number of circuit cards from a number of electrical connectors according to claim 1 wherein the cooperative relationship is defined by the pivoting of the second ejector lever from the first position to the second position moving the engagement surface of each foot from a position within a plane of the second lower surface to a position below the second lower surface and in a direction closer to the number of electrical connectors than the second lower surface to engage the top end of the second frame member and move the second lower surface out of the abutting relationship with the top end of the second frame member.

12. An apparatus for removing a number of circuit cards from a number of electrical connectors according to claim 1 wherein the number of circuit cards is one circuit card and the number of electrical connectors is one electrical connector.

13. An apparatus for removing a number of circuit cards from a number of electrical connectors according to claim 1 wherein the number of circuit cards is greater than one circuit card and the number of electrical connectors is greater than one electrical connector.

14. An apparatus for removing a number of circuit cards from a number of electrical connectors according to claim 1 wherein the first ejector lever and the second ejector lever are constructed of sheet metal.

15. An apparatus for removing a number of circuit cards from a number of electrical connectors, said number of electrical connectors mounted on a back plane contained within a housing, each one of said number of circuit cards having an edge connector adapted to be removably seated in an electrically contacting relationship with a corresponding one of said number of electrical connectors, said number of electrical connectors being positioned between a first frame member and a second frame member, said first frame member and said second frame member each attached at a lower end to said housing adjacent opposing ends of each of said number of electrical connectors and extending substantially a length of said number of circuit cards, comprising:

a. an elongate panel having a first end and a second end which is attached to an edge of each one of the number of circuit cards, said edge of each one of the number of circuit cards opposing the edge connector in a direction along said length, each one of the number of circuit cards parallel to every other one of the number of circuit cards, said panel being attached in a plane substantially perpendicular to a plane of each one of the number of circuit cards, said panel comprising a first lower surface adjacent said first end, a second lower surface adjacent said second end, a first socket means adjacent said first lower surface such that said plane of said each one of the number of circuit cards are positioned therebetween, a second socket means adjacent said second lower surface such that said plane of said each one of the number of circuit cards are positioned therebetween; and b. ejector lever means comprising a socket engagement means and a foot means, each said socket engagement means pivotally engaging said first socket means and said second socket means to pivotally couple said ejector lever means to said panel, said ejector lever means pivoting over an axis perpendicular to said plane of said each one of the number of circuit cards, said foot means engaging a top end of said first frame member and a top end of said second frame member in response to a pivotal movement of said ejector lever means, said ejector lever means being in a first position when each one of the number of circuit cards is in a removably seated and electrically contacting relationship with the corresponding one of the number of electrical connectors when said first lower surface is abutting said top end of said first frame member and said second lower surface is abutting said top end of said second frame member, a pivoting force being applied to said ejector lever means to pivot said ejector lever means to a second position causing said foot means to engage said top end of said first frame member and said top end of said second frame member to provide an extraction force to extract the number of circuit cards in a direction along said length towards said panel from said removably seated and electrical contact relationship with the number of electrical connectors, the second position defined by each one of the number of circuit cards not being seated within and not in electrical contact relationship with the corresponding one of the number of electrical connectors, said foot means providing said extraction force within said plane of any one of the number of circuit cards.

16. An apparatus for removing a number of circuit cards from a number of electrical connectors according to claim 15 wherein the first socket means comprises a first pair of sockets and the second socket means comprise a second pair of sockets, said first pair of sockets adjacent the first lower surface such that the plane of the each one of the number of circuit cards are positioned therebetween, said second pair of sockets adjacent the second lower surface such that the plane of the each one of the number of circuit cards are positioned therebetween.

17. An apparatus for removing a number of circuit cards from a number of electrical connectors according to claim 16 wherein the ejector lever means comprises a first ejector lever and a second ejector lever, the socket engagement means comprises a socket engagement element, and the foot means comprises a foot.

18. An apparatus for removing a number of circuit cards from a number of electrical connectors according to claim 17 wherein the first ejector lever comprises a pair of legs joined by a handle portion wherein each leg has a socket engagement element and a foot, each said socket engagement element seated within and pivotally engaging a corresponding one of the first pair of sockets to pivotally couple said first ejector lever to the panel, said first ejector lever pivoting over an axis perpendicular to the plane of each one of the number of circuit cards, each said foot having an engagement surface adjacent the first lower surface and disposed on opposing sides of the plane of each one of the number of circuit cards to engage the top end of the first frame member in response to the pivotal movement of the first ejector lever.

19. An apparatus for removing a number of circuit cards from a number of electrical connectors according to claim 18 wherein the second ejector lever comprises a pair of legs joined by a handle portion wherein each leg has a socket engagement element and a foot, each socket engagement element seated within and pivotally engaging a corresponding one of the second pair of sockets to pivotally couple the second ejector lever to the panel, the second ejector lever pivoting over an axis perpendicular to the plane of said each one of the number of circuit cards, each foot having an engagement surface adjacent the second lower surface and disposed on opposing sides of the plane of each one of the number of circuit cards to engage the top end of the second frame member in response to a pivotal movement of said second ejector lever, the first ejector lever and said second ejector lever being in the first position when each one of the number of circuit cards is in the removably seated and electrically contacting relationship with the corresponding one of the number of electrical connectors when the first lower surface is abutting the top end of the first frame member and said second lower surface is abutting the top end of said second frame member, a pivoting force being applied to the first ejector lever and said second ejector lever to pivot the first ejector lever and said second ejector lever to the second position causing each engagement surface of each foot of the first ejector lever to move in a cooperative relationship relative to the first lower surface to engage the top end of the first frame member and each engagement surface of each foot of said second ejector lever to move in a cooperative relationship relative to said second lower surface to engage the top end of the second frame member to provide the extraction force to extract the number of circuit cards in a direction along the length towards the panel from the removably seated and electrical contact relationship with the number of electrical connectors, the second position defined by each one of the number of circuit cards not being seated within and not in electrical contact relationship with the corresponding one of the number of electrical connectors, all the planes of each one of the number of circuit cards being positioned between the engagement surface of each foot of the first ejector lever and all the planes of each of the number of circuit cards being positioned between said engagement surface of each foot of said second ejector lever providing the extraction force within the plane of any one of the number of circuit cards.

20. An apparatus for removing a number of circuit cards from a number of electrical connectors according to claim 19 wherein the pivoting force comprises a first pivoting force and a second pivoting force, said first pivoting force applied to said handle portion of said first ejector lever in a direction from the second end towards the first end of said panel and said second pivoting force applied to said handle portion of said second ejector lever in a direction from the first end towards the second end of said panel.

21. An apparatus for removing a number of circuit cards from a number of electrical connectors according to claim 19 wherein the pivoting force is applied to said handle portion of said first ejector lever and to said handle portion of said second ejector lever.

22. An apparatus for removing a number of circuit cards from a number of electrical connectors according to claim 19 wherein the first ejector lever and the second ejector lever comprise each one of the socket engagement elements having a circular element, said circular element having a thickness, a minor radius being defined between a center of said circular element and an outer perimeter of said circular element, each one of the pair of sockets being outwardly open away from the plane of each one of the number of circuit cards and sized to fitably receive and pivotally engage a corresponding circular element of the corresponding one of the pair of socket engagement elements so that the rotation axis corresponds to said center of said corresponding circular element of the corresponding one of the pair of socket engagement elements, said minor radius being in a direction parallel to the plane of each one of the number of circuit cards, the handle portion imparting an inward urging force upon each corresponding circular element of the corresponding one of the pair of socket engagement elements in a perpendicular direction towards the plane of the circuit card to hold each said one of each corresponding circular element of the corresponding one of the pair of socket engagement elements in the fitably received and pivotally engaged relationship with the corresponding one of the pair of sockets.

23. An apparatus for removing a number of circuit cards from a number of electrical connectors according to claim 22 wherein the first ejector lever and the second ejector lever each further comprise each leg having a first distance being greater than a second distance, said first distance and said second distance measured in a direction perpendicular to the axis of rotation of each leg, said first distance measured between the center and a top surface of the handle portion, said second distance measured between the center and a distal end of the engagement surface, said distal end defined as the portion of the engagement surface furthest from the center.

24. An apparatus for removing a number of circuit cards from a number of electrical connectors according to claim 23 wherein said the first ejector lever and the second ejector lever each further comprise each leg having the second distance being greater than the minor radius.

25. An apparatus for removing a number of circuit cards from a number of electrical connectors according to claim 24 wherein the first lower surface has an opening corresponding to each engagement surface for each foot for passing the engagement surface therethrough as the first ejector lever is pivoted from the first position to the second position, pivoting the first ejector lever from the first position to the second position moving the engagement surface of each foot from a position within a plane of the first lower surface to a position below said plane of said first lower surface in a direction closer to the number of electrical connectors than the first lower surface to engage the top end of the first frame member and move the first lower surface out of the abutting relationship with the top end of the first frame member, each foot having an arcuate outer perimeter defined by a major radius equivalent to the second distance to maintain a same distance between the portion of said outer perimeter within said plane of the first lower surface and an edge of the opening within said plane of the first lower surface as the foot is rotated from the first position to the second position, a first position stopping surface on each leg engaging a corresponding first position stopping surface on the panel when the leg is in the first position to prevent the engagement surface of each foot from moving to a position above the plane of the first lower surface, a second position stopping surface on each leg engaging a corresponding second position stopping surface on the panel when in the second position to prevent the engagement surface of each foot from moving beyond a predefined distance below the plane of the first lower surface.

26. An apparatus for removing a number of circuit cards from a number of electrical connectors according to claim 24 wherein the second lower surface has an opening corresponding to each engagement surface for each foot for passing the engagement surface therethrough as the second ejector lever is pivoted from the first position to the second position, pivoting the second ejector lever from the first position to the second position moving the engagement surface of each foot from a position within a plane of the second lower surface to a position below said plane of said second lower surface in a direction closer to the number of electrical connectors than the second lower surface to engage the top end of the second frame member and move the second lower surface out of the abutting relationship with the top end of the second frame member, each foot having an arcuate outer perimeter defined by a major radius equivalent to the second distance to maintain a same distance between the portion of said outer perimeter within said plane of the second lower surface and an edge of the opening within said plane of the second lower surface as the foot is rotated from the first position to the second position, a first position stopping surface on each leg engaging a corresponding first position stopping surface on the panel when the leg is in the first position to prevent the engagement surface of each foot from moving to a position above the plane of the second lower surface, a second position stopping surface on each leg engaging a corresponding second position stopping surface on the panel when in the second position to prevent the engagement surface of each foot from moving beyond a predefined distance below the plane of the second lower surface.

27. An apparatus for removing a number of circuit cards from a number of electrical connectors according to claim 19 wherein the cooperative relationship is defined by the pivoting of the first ejector lever from the first position to the second position moving the engagement surface of each foot from a position within a plane of the first lower surface to a position below the first lower surface and in a direction closer to the electrical connector than the first lower surface to engage the top end of the first frame member and move the first lower surface out of the abutting relationship with the top end of the first frame member.

28. An apparatus for removing a number of circuit cards from a number of electrical connectors according to claim 19 wherein the cooperative relationship is defined by the pivoting of the second ejector lever from the first position to the second position moving the engagement surface of each foot from a position within a plane of the second lower surface to a position below the second lower surface and in a direction closer to the number of electrical connectors than the second lower surface to engage the top end of the second frame member and move the second lower surface out of the abutting relationship with the top end of the second frame member.

29. An apparatus for removing a number of circuit cards from a number of electrical connectors according to claim 19 wherein the number of circuit cards is one circuit card and the number of electrical connectors is one electrical connector.

30. An apparatus for removing a number of circuit cards from a number of electrical connectors according to claim 19 wherein the number of circuit cards is greater than one circuit card and the number of electrical connectors is greater than one electrical connector.

31. An apparatus for removing a number of circuit cards from a number of electrical connectors according to claim 19 wherein the first ejector lever and the second ejector lever are constructed of sheet metal.

* * * * *